(12) United States Patent
Kobayashi et al.

(10) Patent No.: US 8,686,622 B2
(45) Date of Patent: Apr. 1, 2014

(54) COMPOSITE SUBSTRATE AND METHOD FOR MANUFACTURING THE SAME

(75) Inventors: Hiroki Kobayashi, Chiryu (JP); Yuji Hori, Nagoya (JP); Yasunori Iwasaki, Kitanagoya (JP)

(73) Assignee: NGK Insulators, Ltd., Aichi-prefecture (JP)

( * ) Notice: Subject to any disclaimer, the term of this patent is extended or adjusted under 35 U.S.C. 154(b) by 0 days.

(21) Appl. No.: 13/386,854

(22) PCT Filed: Jul. 21, 2010

(86) PCT No.: PCT/JP2010/062238
§ 371 (c)(1),
(2), (4) Date: Jan. 24, 2012

(87) PCT Pub. No.: WO2011/013553
PCT Pub. Date: Feb. 3, 2011

(65) Prior Publication Data
US 2012/0126669 A1    May 24, 2012

(30) Foreign Application Priority Data
Jul. 30, 2009    (JP) .................................. 2009-177587

(51) Int. Cl.
*H01L 41/09*    (2006.01)
*H01L 41/22*    (2013.01)

(52) U.S. Cl.
USPC .......................... 310/369; 310/367; 29/25.35

(58) Field of Classification Search
USPC .................. 310/326, 327, 367–369; 29/25.35
See application file for complete search history.

(56) References Cited

U.S. PATENT DOCUMENTS

| | | | | | |
|---|---|---|---|---|---|
| 3,179,823 | A | * | 4/1965 | Nesh | 310/329 |
| 4,814,659 | A | * | 3/1989 | Sawada | 310/328 |
| 5,182,484 | A | * | 1/1993 | Culp | 310/328 |
| 5,262,696 | A | * | 11/1993 | Culp | 310/328 |

(Continued)

FOREIGN PATENT DOCUMENTS

| | | |
|---|---|---|
| JP | 2006-319679 A | 11/2006 |
| JP | 2009-094661 A | 4/2009 |
| JP | 2009-516966 A | 4/2009 |

OTHER PUBLICATIONS

International Search Report for PCT Patent App. No. PCT/JP2010/062238 (Oct. 26, 2010).

(Continued)

*Primary Examiner* — Thomas Dougherty
(74) *Attorney, Agent, or Firm* — Cermak Nakajima LLP; Tomoko Nakajima

(57) ABSTRACT

The composite substrate is a substrate used to manufacture an acoustic wave device, and includes a support substrate, a piezoelectric substrate, and a adhesive layer with which the support substrate and the piezoelectric substrate are bonded to each other. In the composite substrate, assuming that a surface of the piezoelectric substrate that is bonded to the support substrate is defined as a first surface and a surface at the side opposite to the first surface is defined as a second surface, the piezoelectric substrate is formed such that the first surface is inside the second surface when the first surface is projected onto the second surface in a direction perpendicular to the second surface. In other words, the composite substrate has an outer peripheral surface that is formed such that the circumference thereof increases toward the top surface of the piezoelectric substrate.

11 Claims, 10 Drawing Sheets

(56) References Cited

U.S. PATENT DOCUMENTS

| | | | |
|---|---|---|---|
| 7,262,676 B2 * | 8/2007 | Ruile et al. | 333/193 |
| 2004/0070313 A1 * | 4/2004 | Furukawa et al. | 310/313 R |
| 2008/0292127 A1 | 11/2008 | Ruile et al. | |

OTHER PUBLICATIONS

International Preliminary Report on Patentability for PCT Patent App. No. PCT/JP2010/062238 (Feb. 16, 2012).

* cited by examiner

Example 1          Comparative Example 1

COMPOSITE SUBSTRATE AND METHOD FOR MANUFACTURING THE SAME

TECHNICAL FIELD

The present invention relates to a composite substrate and a method for manufacturing the composite substrate.

This application is a national phase entry under 35 U.S.C. §371 of PCT Patent Application No. PCT/JP2010/062238, filed on Jul. 21, 2010, which claims priority under 35 U.S.C. §119 to Japanese Patent Application No. 2009-177587, filed Jul. 30, 2009, both of which are incorporated by reference.

BACKGROUND ART

Acoustic wave devices manufactured by arranging electrodes on a composite substrate including a support substrate and a piezoelectric substrate that are bonded together have been known. The acoustic wave devices are used as, for example, band-pass filters in communication devices, such as mobile phones. In known composite substrates, the piezoelectric substrate is formed of lithium niobate, lithium tantalate, etc., and the support substrate is formed of silicon, quartz, etc. (see Patent Document 1).

CITATION LIST

Patent Document

[Patent Document 1] Japanese Unexamined Patent Application Publication No. 2006-319679

DISCLOSURE OF INVENTION

Such a composite substrate is generally manufactured by preparing a piezoelectric substrate and a support substrate, bonding these substrates together with an organic adhesive layer interposed therebetween, and reducing the thickness of the piezoelectric substrate. Since a corner portion of the piezoelectric substrate may come into contact with something and break when the substrate is being handled, the corner portion of the piezoelectric substrate is generally chamfered or rounded. In the process of reducing the thickness of the piezoelectric substrate, a surface of the piezoelectric substrate is polished by a polishing plate while abrasive grains are provided between the surface of the piezoelectric substrate and the polishing plate. In the above-described manufacturing method, when the piezoelectric substrate and the support substrate are bonded together, there is a possibility that the organic adhesive layer does not extend to the chamfered or rounded portion at the rim of the piezoelectric substrate. When the surface of the piezoelectric substrate in this state is polished with the polishing plate, chipping often occurs at the rim of the piezoelectric substrate. In addition, the composite substrate may be subjected to a process that involves heating after the polishing process. In such a case, cracks may be generated at an edge portion of the piezoelectric substrate owing to expansion and contraction thereof when the piezoelectric substrate is heated.

In view of the above-described problem, the main object of the present invention is to provide a composite substrate in which a piezoelectric substrate and a support substrate are bonded together with an adhesive layer therebetween and with which the occurrence of defects at an edge portion of the composite substrate can be reduced, and a method for manufacturing the composite substrate.

To achieve the above-described object, the following means is employed.

A composite substrate according to the present invention includes:
 a support substrate;
 a piezoelectric substrate; and
 an adhesive layer with which the support substrate and the piezoelectric substrate are bonded to each other,
 wherein, assuming that a surface of the piezoelectric substrate that is bonded to the support substrate is defined as a first surface and a surface at the side opposite to the first surface is defined as a second surface, the piezoelectric substrate has a bulging portion that is formed such that the first surface is inside the second surface when the first surface is projected onto the second surface in a direction perpendicular to the second surface, and
 wherein the composite substrate has an outer peripheral surface that continuously extends from the piezoelectric substrate to the support substrate through the adhesive layer.

A method for manufacturing a composite substrate according to the present invention, includes:
 (a) a step of preparing a support substrate and a piezoelectric substrate having a corner that is chamfered or rounded;
 (b) a step of forming a bonded substrate by bonding a bonding portion at a surface of the support substrate and a back surface of the piezoelectric substrate to each other with an adhesive layer interposed therebetween; and
 (c) a step of grinding an outer peripheral surface of the bonded substrate and polishing a surface of the piezoelectric substrate with a polishing plate while abrasive grains are provided between the surface of the piezoelectric substrate and the polishing plate so that a thickness of the piezoelectric substrate is reduced and the surface of the piezoelectric substrate is mirror polished,
 wherein, in step (c), assuming that a surface of the piezoelectric substrate that is bonded to the support substrate is defined as a first surface and a surface at the side opposite to the first surface is defined as a second surface, a bulging portion is formed in the piezoelectric substrate such that the first surface is inside the second surface when the first surface is projected onto the second surface in a direction perpendicular to the second surface, and the bonded substrate is processed such that an outer peripheral surface that continuously extends from the piezoelectric substrate to the support substrate through the adhesive layer is formed.

In the composite substrate according to the present invention, assuming that a surface of the piezoelectric substrate that is bonded to the support substrate is defined as a first surface and a surface at the side opposite to the first surface is defined as a second surface, the piezoelectric substrate has a bulging portion that is formed such that the first surface is inside the second surface when the first surface is projected onto the second surface in a direction perpendicular to the second surface. In addition, the composite substrate has an outer peripheral surface that continuously extends from the piezoelectric substrate to the support substrate through the adhesive layer. With the composite substrate and the method for manufacturing the composite substrate according to the present invention, the occurrence of defects at the edge portion of the composite substrate can be reduced. The reason why the above-described effects can be achieved is believed to be as follows. That is, for example, in the piezoelectric substrate, the second surface, which is not bonded to the support substrate, is larger than the first surface, which is bonded to the support substrate with the adhesive layer. Thus, the volume of the second surface, which has more freedom than the first surface, is relatively large. The bulging portion probably serves to reduce the stress applied to the edge portion when the support substrate and the piezoelectric substrate expand or contract in the heating process or the like. In addition, since the outer peripheral surface is formed so as to extend continuously, the defects at the outer peripheral surface in which the substrates are bonded together can be further reduced.

BEST MODE FOR CARRYING OUT THE INVENTION

Figure 1:
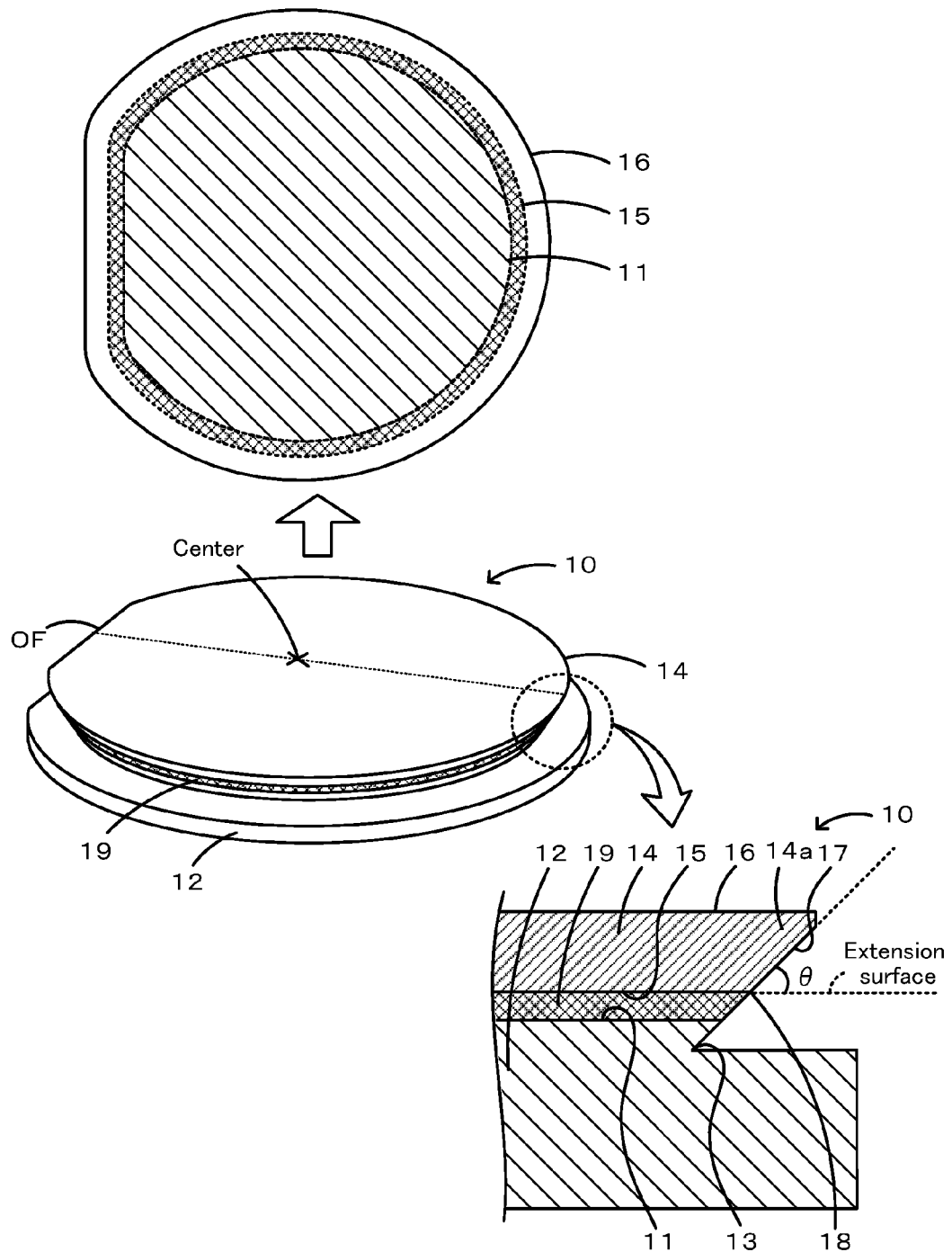
FIG. 1 is a schematic diagram illustrating the structure of a composite substrate 10.

An embodiment of the present invention will now be described with reference to the drawings. FIG. 1 is a schematic diagram illustrating the structure of a composite substrate 10 according to an embodiment of the present invention. The composite substrate 10 according to the present invention is formed by bonding a plurality of substrates together. The composite substrate 10 includes a support substrate 12, a piezoelectric substrate 14, and an adhesive layer 19 with which the support substrate 12 and the piezoelectric substrate 14 are bonded to each other. In the composite substrate 10, assuming that a surface of the piezoelectric substrate 14 that is bonded to the support substrate 12 is defined as a first surface 15 and a surface at the side opposite to the first surface 15 is defined as a second surface 16, the piezoelectric substrate 14 has a bulging portion 14a that is formed such that the first surface 15 is inside the second surface 16 when the first surface 15 is projected onto the second surface 16 in a direction perpendicular to the second surface 16. In addition, the composite substrate 10 according to the present invention has an outer peripheral surface that continuously extends from the piezoelectric substrate 14 to the support substrate 12 through the adhesive layer 19. The composite substrate 10 has a circular shape with a single flat portion. This flat portion is called an orientation flat (OF) portion, and is used to detect the position and orientation of a wafer when, for example, the wafer is subjected to various operations in a process of manufacturing a surface acoustic wave device.

The support substrate 12 supports the piezoelectric substrate 14 that is bonded to a bonding surface 11, which is the top surface of the support substrate 12. The material of the support substrate 12 may be, for example, silicon, sapphire, aluminum nitride, alumina, borosilicate glass, silica glass, lithium tantalate, lithium niobate, lithium niobate-lithium tantalate solid-solution single crystal, lithium tetraborate, langasite, or quartz. The support substrate 12 has a constricted part 13 that has a smaller circumference than that of the bonding surface 11 at a position between the bonding surface 11, which is the top surface, and the bottom surface. The constricted part 13 is shaped such that a cross section of the constricted part 13 (cross section that is parallel to the bonding surface 11) is inside the bonding surface 11 when the cross section is projected onto the bonding surface 11 in a direction perpendicular to the bonding surface 11. The support substrate 12 may have a coefficient of thermal expansion that differs from that of the piezoelectric substrate 14, and preferably has a coefficient of thermal expansion that is lower than that of the piezoelectric substrate 14. The difference in coefficient of thermal expansion between the support substrate 12 and the piezoelectric substrate 14 may be 5 ppm/° C. or more. Even when the difference in coefficient of thermal expansion is 5 ppm/° C. or more, the occurrence of cracks and chipping at the edge portion of the piezoelectric substrate 14 can be reduced owing to the shape of the piezoelectric substrate 14. When the coefficient of thermal expansion of the piezoelectric substrate 14 is in the range of 13 to 20 ppm/° C., the coefficient of thermal expansion of the support substrate 12 is preferably in the range of 2 to 7 ppm/° C. Table 1 shows the coefficients of thermal expansion of typical materials of the piezoelectric substrate 14 and the support substrate 12 of the composite substrate 10.

TABLE 1

| | Material | Coefficient of thermal expansion (ppm/° C.) |
|---|---|---|
| Piezoelectric substrate | Lithium tantalate (LT) | 16.1 |
| | Lithium niobate (LN) | 15.4 |
| | Quartz | 13.7 |
| | Lithium tetraborate | 13 |
| Support substrate | Silicon | 3 |

The adhesive layer 19 is provided to bond the support substrate 12 and the piezoelectric substrate 14 to each other. Although the material of the adhesive layer 19 is not particularly limited, a heat-resistant organic adhesive is preferably used. For example, an epoxy adhesive or an acrylic adhesive may be used. The adhesive layer 19 is formed such that the circumference thereof increases toward the side adjacent to the piezoelectric substrate 14 from the side adjacent to the support substrate 12.

The piezoelectric substrate 14 may be a substrate capable of propagating acoustic waves (in particular, surface acoustic waves). The material of the piezoelectric substrate 14 may be, for example, lithium tantalate, lithium niobate, lithium niobate-lithium tantalate solid-solution single crystal, lithium tetraborate, langasite, or quartz. The surface (bottom surface) of the piezoelectric substrate 14 that is bonded to the support substrate 12 is defined as the first surface 15, and the surface (top surface) of the piezoelectric substrate 14 at the side opposite to the first surface 15 is defined as the second surface 16. The piezoelectric substrate 14 includes the bulging portion 14a that is formed such that the first surface 15 is inside the second surface 16 when the first surface 15 is projected onto the second surface 16 in a direction perpendicular to the second surface 16. In other words, an outer peripheral surface 17 of the piezoelectric substrate 14 is formed such that the circumference thereof increases toward the second surface 16 from the first surface 15. The first surface 15 is the surface that is bonded to the support substrate 12. The outer peripheral surface 17 of the piezoelectric substrate 14 is formed such that, in a cross section that is perpendicular to the second surface 16 and that passes through the center of the composite substrate 10, an angle θ between the tangent line that extends from the first surface 15 toward the bulging portion 14a of the piezoelectric substrate 14 and the extension line of the first surface 15 is acute. The center of the composite substrate 10 may be, for example, the center of the external shape of the composite substrate 10 excluding the OF portion (see FIG. 1). The angle θ is preferably less than 90° and more than 0°, more preferably, 70° or less and 20° or more. When the angle θ is 70° or less and 20° or more, the mechanical strength of the edge portion of the piezoelectric substrate 14 can be increased. The coefficient of thermal expansion of the piezoelectric substrate 14 may be in the range of 13 to 20 ppm/° C.

The composite substrate 10 may be used to manufacture an acoustic wave device. The acoustic wave device may be, for example, a surface acoustic wave device, a Lamb wave device, or a film bulk acoustic resonator (FBAR). For example, the surface acoustic wave device is formed by arranging an input interdigital transducer (IDT) electrode (also referred to as a comb-shaped electrode or an interdigital transducer) for exciting a surface acoustic wave and an output IDT electrode that receives the surface acoustic wave on the surface of the piezoelectric substrate. When a high-frequency signal is applied to the input IDT electrode, an electric field is generated between the electrodes and a surface acoustic wave is excited and propagated along the piezoelectric substrate. The output IDT electrode, which is located at a position toward which the surface acoustic wave is propagated, outputs an electric signal based on the propagated surface acoustic wave. In the acoustic wave device manufactured by using the composite substrate 10 according to the present invention, the stress generated by thermal expansion or the like can be reduced. Accordingly, the occurrence of defects, such as cracks and chipping, at the edge portion of the piezoelectric substrate 14, the adhesive layer 19, or the support substrate 12 can be reduced.

Figure 2:
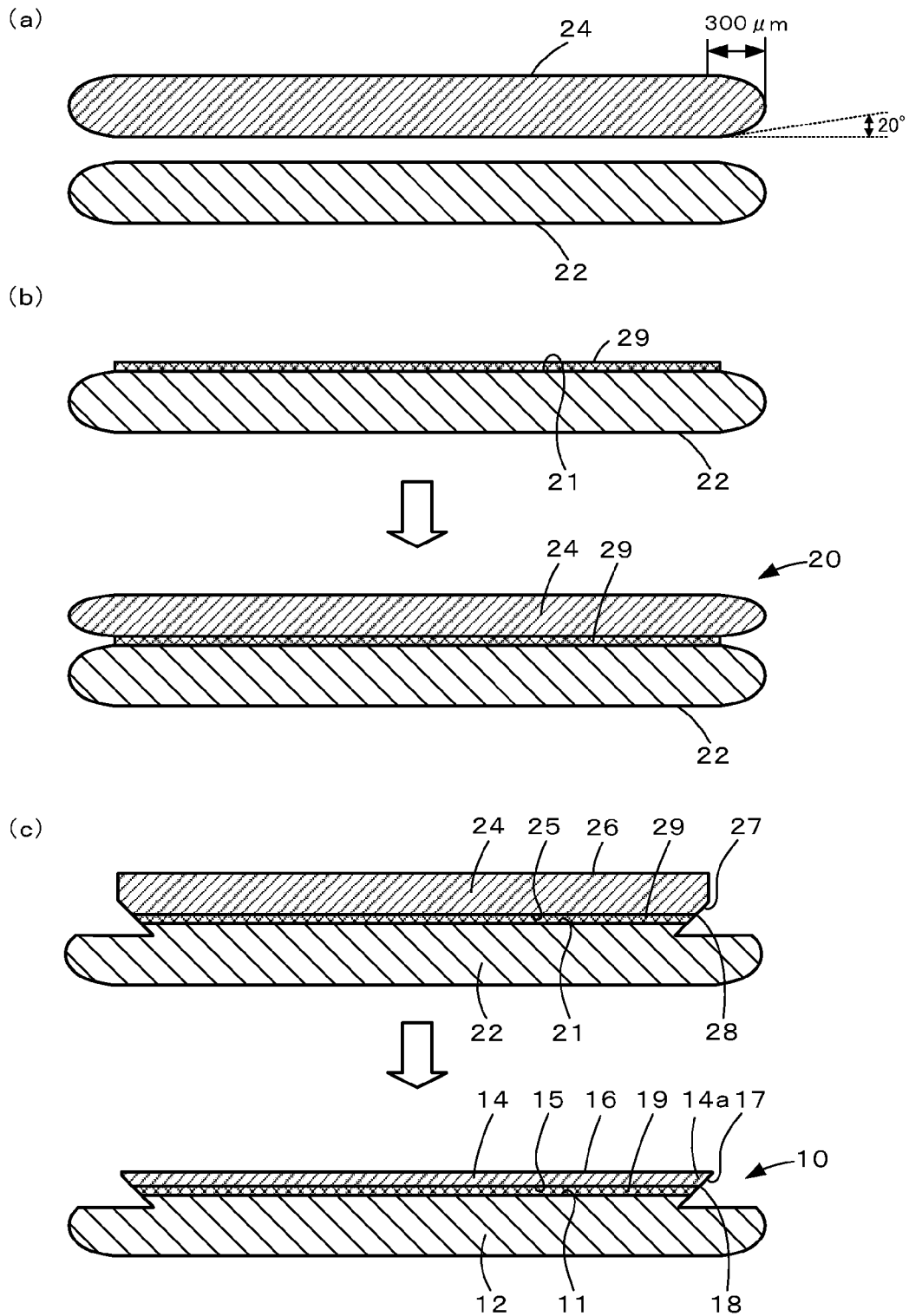
FIG. 2 shows schematic sectional views illustrating an example of a manufacturing process of the composite substrate 10.
Figure 3:
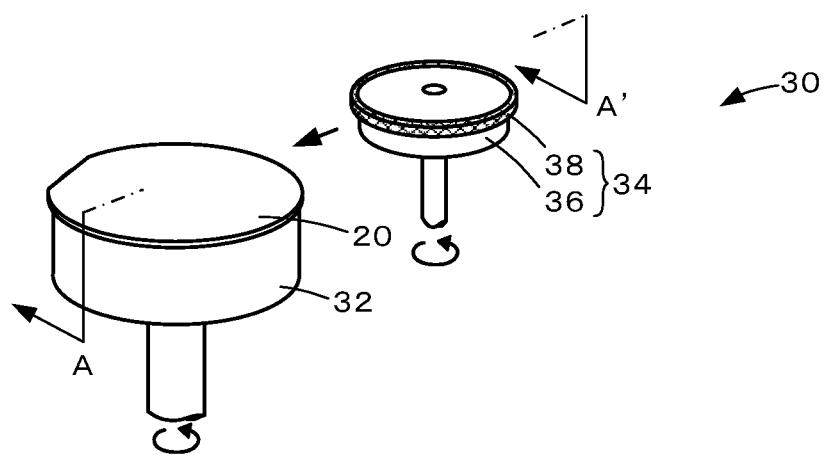
FIG. 3 is a schematic diagram illustrating the structure of a grinding device 30.
Figure 4:
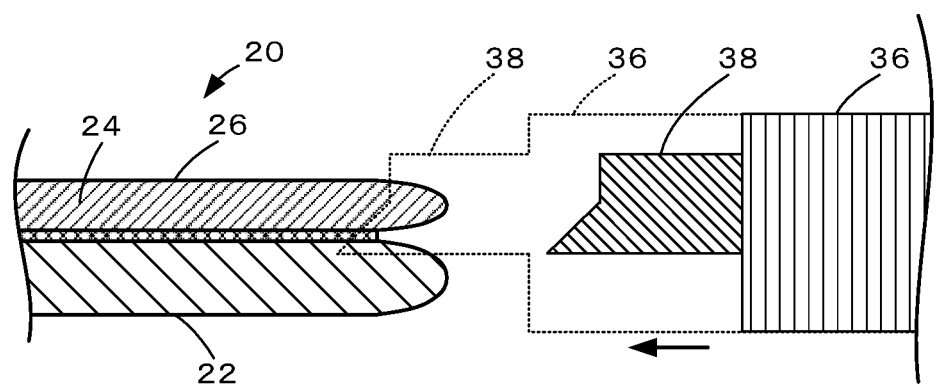
FIG. 4 is a partial sectional view taken along line A-A' illustrating the manner in which a grinding wheel 34 is moved in a process of grinding an outer peripheral surface of a bonded substrate 20 before polishing.

Next, an example of a method for manufacturing the composite substrate 10 will be described. FIG. 2 shows schematic sectional views illustrating an example of a manufacturing process of the composite substrate 10. FIG. 3 is a schematic diagram illustrating the structure of a grinding device 30. FIG. 4 is a partial sectional view taken along line A-A' illustrating the manner in which a grinding wheel 34 is moved in a process of grinding an outer peripheral surface of a bonded substrate 20 before polishing. The method for manufacturing the composite substrate 10 includes (a) a step of preparing a support substrate and a piezoelectric substrate having a chamfered or rounded corner; (b) a step of forming a bonded substrate by bonding the support substrate and the piezoelectric substrate together; and (c) a step of grinding an outer peripheral surface of the bonded substrate, reducing the thickness of the piezoelectric substrate, and mirror-polishing a surface of the piezoelectric substrate. Here, substrates that are not yet subjected to the grinding process are referred to as a support substrate 22, a piezoelectric substrate 24, and an adhesive layer 29.

In step (a), the support substrate 22 and the piezoelectric substrate 24 that is capable of propagating acoustic waves and has a chamfered or rounded corner are prepared (FIG. 2(a)). Substrates made of the above-mentioned materials may be used as the support substrate 22 and the piezoelectric substrate 24. The size of the support substrate 22 is not particularly limited. For example, the support substrate 22 may have a diameter in the range of 50 to 150 mm and a thickness in the range of 250 to 500 μm. The support substrate 22 may have a chamfered or rounded corner. The size of the piezoelectric substrate 24 is not particularly limited. For example, the piezoelectric substrate 24 may have a diameter in the range of 50 to 150 mm and a thickness in the range of 250 to 500 μm. Since the piezoelectric substrate 24 has a chamfered or rounded corner, even when the corner of the piezoelectric substrate comes into contact with something when the piezoelectric substrate is carried, chipping does not easily occur. The corner may either be chamfered such that the corner (ridge) between two surfaces is cut along a plane at a certain angle, or rounded such that the ridge is cut along a curve with a certain radius of curvature. A layer of metal or silicon dioxide having a thickness in the range of 0.1 to 5 μm may be formed on the back surface of the piezoelectric substrate.

In step (b), the bonded substrate 20 is formed by bonding a bonding surface 21, which is the top surface of the support substrate 22 and a first surface 25, which is the back surface of the piezoelectric substrate 24 to each other with the adhesive layer 29 interposed therebetween. For example, an adhesive is uniformly applied to one or both of the bonding surface 21 and the first surface 25, and the adhesive is solidified while the bonding surface 21 and the first surface 25 are in contact with each other. Thus, the bonded substrate 20 is formed (FIG. 2(b)). As the adhesive, a heat-resistant organic adhesive is preferably used. For example, an epoxy adhesive or an acrylic adhesive is preferably used. The organic adhesive may be applied to one or both of the bonding surface 21 and the first surface 25 by, for example, spin-coating or printing. In the case where the coefficient of thermal expansion of the support substrate prepared in step (a) is lower than that of the piezoelectric substrate, the thickness of the adhesive layer formed by a heating process is preferably 0.1 μm or more and 1.0 μm or less. When the thickness of the adhesive layer is 1.0 μm or less, variation in frequency characteristics caused by temperature variation can be suppressed. When the thickness of the adhesive layer is 0.1 μm or more, the influence of voids can be reduced and variation in frequency characteristics caused by temperature variation can be suppressed.

In step (c), the outer peripheral surface of the bonded substrate is ground, the thickness of the piezoelectric substrate is reduced, and the surface of the piezoelectric substrate is mirror-polished (FIG. 2(c)). More specifically, in step (c), the outer peripheral surface of the bonded substrate is ground so as to form an outer peripheral surface that continuously extends from the piezoelectric substrate to the support substrate through the adhesive layer. In this step, at least a part of the outer peripheral surface of the composite substrate 10 is formed as a single outer peripheral surface that continuously extends from the piezoelectric substrate to the support substrate through the adhesive layer. In step (c), assuming that the surface of the piezoelectric substrate that is bonded to the support substrate is defined as the first surface 25 and a surface at the side opposite to the first surface after the thickness of the piezoelectric substrate 14 is reduced is defined as the second surface 16, the bulging portion 14a is formed in the piezoelectric substrate 14 such that the first surface 25 is inside the second surface 16 when the first surface 25 is projected onto the second surface 16 in a direction perpendicular to the second surface 16. Here, an outer peripheral surface 27 may be formed by the grinding process such that the circumference thereof increases toward a top surface 26 of the piezoelectric substrate 24 from the bonding surface 21 of the support substrate 22. In such a case, the piezoelectric substrate 14 that has a larger area than that of the bonding surface 11 of the support substrate 12 is formed above the bonding surface 11, and the stress at an outer peripheral edge portion of the composite substrate 10 can be reduced. In step (c), when the outer peripheral surface of the bonded substrate 20 is ground, a part of the support substrate 22 is preferably ground together with the piezoelectric substrate 24 and the adhesive layer 29 so that, for example, the constricted part 13 is formed in the support substrate 12. In such a case, the outer peripheral portion of the adhesive layer 29, at which unbonded portions are easily formed, can be sufficiently ground. Accordingly, separation at the outer periphery of the adhesive layer can be suppressed. In addition, the bonded substrate may be processed such that, in a cross section that is perpendicular to the second surface 16 and that passes through the center of the composite substrate 10, the angle θ between the tangent line that extends from the first surface 25 toward the bulging portion 14a of the piezoelectric substrate 14 and the extension line of the first surface 25 is acute. The angle θ is preferably less than 90° and more than 0°, more preferably, 70° or less and 20° or more. When the angle θ is 70° or less and 20° or more, the mechanical strength of the edge portion of the piezoelectric substrate 14 can be increased. In step (c), the bonded substrate is preferably processed such that the chamfered or rounded portion of the piezoelectric substrate is eliminated. The bonded substrate may be ground such that the chamfered or rounded portion of the piezoelectric substrate is eliminated at least at the side adjacent to the adhesive layer 29. In such a case, the support substrate 12 and the piezoelectric substrate 14 can be reliably bonded together by the adhesive layer 19, and separation or the like at the outer periphery of the adhesive layer 19 can be suppressed. In step (c), the grinding process may be performed such that the original outer diameter of the support substrate is maintained. In such a case, a device, a jig, etc., that comply with the standard corresponding to the maintained outer diameter may be used both before and after step (c) is performed.

As a grinding device for grinding the outer peripheral surface of the bonded substrate 20, the grinding device 30 illustrated in FIG. 3, for example, may be used. The grinding device 30 grinds the outer peripheral surface of the bonded substrate 20 by bringing a grindstone portion 38 of the grinding wheel 34 that rotates into contact the outer peripheral surface of the bonded substrate 20 that also rotates. Alternatively, a grinding device that brings the outer peripheral surface of the bonded substrate that rotates into contact with a grindstone that does not rotate or a grinding device that brings a grindstone of a grinding wheel that rotates and revolves around the bonded substrate into contact with the outer peripheral surface of the bonded substrate may be used instead. The grinding device 30 includes a grinding mechanism that grinds the outer peripheral surface of the bonded substrate 20 by horizontally moving the grinding wheel 34, whose height is adjusted in advance, while rotating the grinding wheel 34, so that the grindstone portion 38 of the grinding wheel 34 is pressed against the outer peripheral surface of the bonded substrate 20. In the grinding device 30, the bonded substrate 20 is retained on a rotating table 32 by vacuum attraction such that the support substrate 12 is at the bottom. The bonded substrate 20 is rotated in the same direction as the direction in which the grinding wheel 34 is rotated. The grindstone portion 28 is a ring-shaped member that is fixed to a side surface of an upper portion of a grinding-wheel body 36. As illustrated in FIG. 4, in cross section, the grindstone portion 28 has a rectangular shape with a triangular part at the outer peripheral end thereof. The dotted lines in FIG. 4 show the position of the grinding wheel 34 at the time when the grinding process in which the grinding wheel 34 is horizontally moved is finished.

In step (c), the top surface 26 of the piezoelectric substrate 24 is polished by a polishing plate while abrasive grains are provided between the surface of the piezoelectric substrate 24 and the polishing plate. Accordingly, the thickness of the piezoelectric substrate 24 is reduced and the surface of the piezoelectric substrate 24 is mirror-polished (FIG. 2(c)). A common polishing machine may be used in this process. For example, in a polishing machine for polishing one side of the bonded substrate 20, first, the bonded substrate 20, which is an object to be polished, is placed between a pressure plate and a polishing plate in a pressurized state. Then, the pressure plate is rotated while slurry including abrasive grains is supplied to between the bonded substrate 20 and the polishing plate, so that the thickness of the piezoelectric substrate 24 is reduced. Then, the polishing plate is changed to a polishing plate having a pad bonded thereto and the abrasive grains are changed to those having a higher grain size number. Then, the pressure plate is rotated and revolved, so that the surface of the piezoelectric substrate 24 is mirror polished. In the bonded substrate 20 that is subjected to step (c), the piezoelectric substrate 24 is not separated from the adhesive layer 29 at the rim thereof. Therefore, unlike a bonded substrate in which the piezoelectric substrate 24 is separated from the adhesive layer 29 at the rim thereof (for example, unlike the bonded substrate before step (c)), when the surface of the piezoelectric substrate 24 is polished with the abrasive grains, chipping does not easily occur at the rim of the piezoelectric substrate 24.

According to the above-described method for manufacturing the composite substrate 10 of the present embodiment, the composite substrate 10 illustrated in FIG. 1 can be manufactured. In the composite substrate 10, the piezoelectric substrate 14 is formed such that the first surface 15 is inside the second surface 16 when the first surface 15 is projected onto the second surface 16 in a direction perpendicular to the second surface 16. In addition, the support substrate 12 is formed such that the bonding surface 11 is inside the second surface 16 when the bonding surface 11 is projected onto the second surface 16 in a direction perpendicular to the second surface 16. In the composite substrate 10, the piezoelectric substrate 14 that has a larger circumference than that of the bonding surface 11 of the support substrate 12 is formed above the bonding surface 11. Therefore, the occurrence of cracks or the like at the edge portion of the composite substrate 10 due to expansion and contraction of the composite substrate 10 in, for example, the subsequent heating process can be reduced. This is probably because since the piezoelectric substrate 14 that is larger than the bonding portion 11 of the support substrate 12 is formed above the bonding portion 11, the stress applied to the edge portion when the support substrate 12 and the piezoelectric substrate 14 expand or contract in the heating process or the like can be reduced. When step (c) is performed, the chamfered or rounded portion at the outer peripheral surface of the piezoelectric substrate 14 is eliminated. Therefore, the piezoelectric substrate 14 is not separated from the adhesive layer 19 at the rim thereof.

Accordingly, compared to the case in which the piezoelectric substrate 14 has a chamfered or rounded portion and is separated from the adhesive layer 19 at the rim thereof, chipping does not easily occur. This is probably because if the piezoelectric substrate 14 is separated from the adhesive layer 19 at the rim thereof, the rim portion forms a sharp edge when the surface of the piezoelectric substrate 14 is polished and chipping easily occurs when a force is applied to the piezoelectric substrate 14 in the thickness direction in the polishing process. When the piezoelectric substrate 14 is not separated from the adhesive layer 19 at the rim thereof, such chipping does not easily occur. Thus, the defects at the edge portion of the composite substrate can be reduced.

It is to be understood that the present invention is not limited to the embodiments described above, and can be realized in various forms within the technical scope of the present invention.

Figure 5:
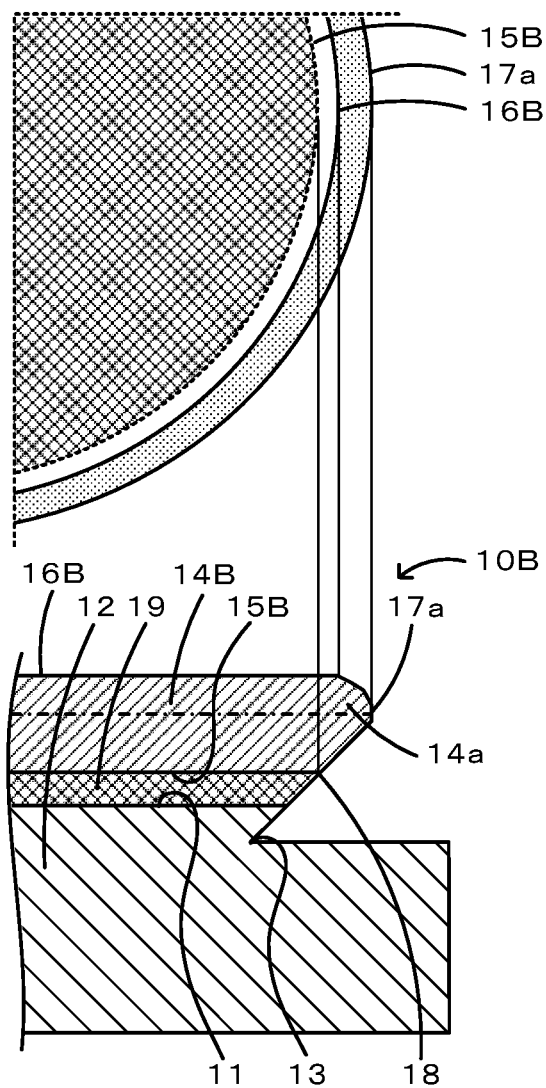
FIG. 5 shows schematic sectional views illustrating the structure of a composite substrate 10B.

For example, in the above-described embodiment, the outer peripheral surface 17 is formed such that the circumference thereof increases toward the second surface 16 from the first surface 15. However, as illustrated in FIG. 5, a composite substrate 10B may be formed such that the top surface of the piezoelectric substrate is chamfered or rounded. In the composite substrate 10B, similar to the above-described composite substrate 10, a piezoelectric substrate 14B is formed such that a first surface 15B is inside a second surface 16B when the first surface 15B is projected onto the second surface 16B in a direction perpendicular to the second surface 16B. In addition, the piezoelectric substrate 14B includes a projecting portion 17a that has a larger circumference than that of the second surface 16B at a position between the second surface 16B, which is the top surface, and the first surface 15B, which is the bottom surface. The projecting portion 17a is shaped such that a cross section of the projecting portion 17a (cross section that is parallel to the first surface 15) is inside the first surface 15 when the cross section is projected onto the second surface 16B in a direction perpendicular to the second surface 16B. Also in this case, the second surface 16B, which is not bonded to the support substrate 12, is larger than the first surface 15B, which is bonded to the support substrate 12 with the adhesive layer 19, and the occurrence of defects at the edge portion can be reduced.

Figure 6:
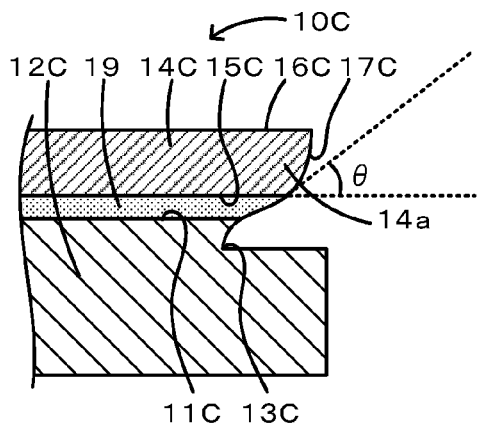
FIG. 6 is a schematic sectional view illustrating the structure of a composite substrate 10C.

In the above-described embodiment, the outer peripheral surface has a linear shape in cross section. However, as illustrated in FIG. 6, a composite substrate 10C may be formed such that an outer peripheral surface thereof has a curved shape in cross section. A support substrate 12C is formed such that an outer peripheral surface of the support substrate 12C extends substantially perpendicularly from a constricted part 13C toward a bonding surface 11C and is then gradually inclined outward. A piezoelectric substrate 14C is formed such that, as a point on the outer peripheral surface of the composite substrate 10C moves toward the second surface 16C from the first surface 15C, the direction of outward inclination of the outer peripheral surface of the composite substrate 10C becomes closer to a direction substantially perpendicular to the piezoelectric substrate 14C. The composite substrate 10C also has an outer peripheral surface that extends continuously from the piezoelectric substrate 14C to the support substrate 12C through the adhesive layer 19. The composite substrate 10C is also formed such that the first surface 15C is inside the second surface 16C when the first surface 15C is projected onto the second surface 16C in a direction perpendicular to the second surface 16C. Accordingly, the occurrence of defects at the edge portion can be reduced.

Figure 7:
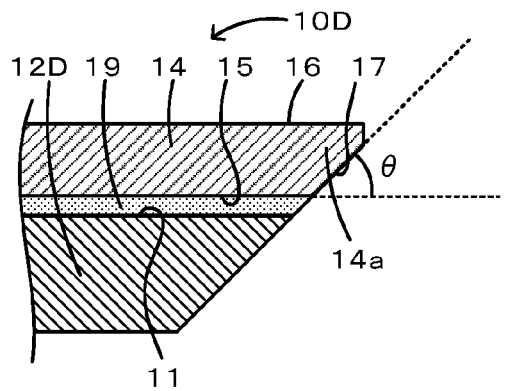
FIG. 7 is a schematic sectional view illustrating the structure of a composite substrate 10D.

In the above-described embodiment, the constricted part 13 is formed in the support substrate 12. However, as illustrated in FIG. 7, a composite substrate 10D may be formed such that a support substrate 12D does not have a constricted part. The composite substrate 10D also has an outer peripheral surface that extends continuously from the piezoelectric substrate 14 to the support substrate 12D through the adhesive layer 19. The composite substrate 10D is also formed such that the first surface 15 is inside the second surface 16 when the first surface 15 is projected onto the second surface 16 in a direction perpendicular to the second surface 16. Accordingly, the occurrence of defects at the edge portion can be reduced.

Figure 8:
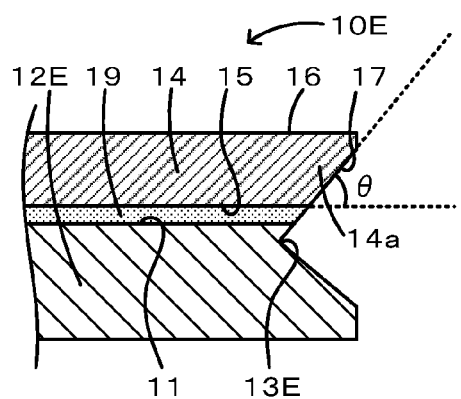
FIG. 8 is a schematic sectional view illustrating the structure of a composite substrate 10E.

In the above-described embodiment, the constricted part 13 of the support substrate 12 has a surface that is parallel to the bonding surface 11. However, as illustrated in FIG. 8, a composite substrate 10E may be formed such that a support substrate 12E has a constricted part 13E having a surface that is inclined with respect to the bonding surface 11. The composite substrate 10E also has an outer peripheral surface that extends continuously from the piezoelectric substrate 14 to the support substrate 12E through the adhesive layer 19. The composite substrate 10E is also formed such that the first surface 15 is inside the second surface 16 when the first surface 15 is projected onto the second surface 16 in a direction perpendicular to the second surface 16. Accordingly, the occurrence of defects at the edge portion can be reduced.

Figure 9:
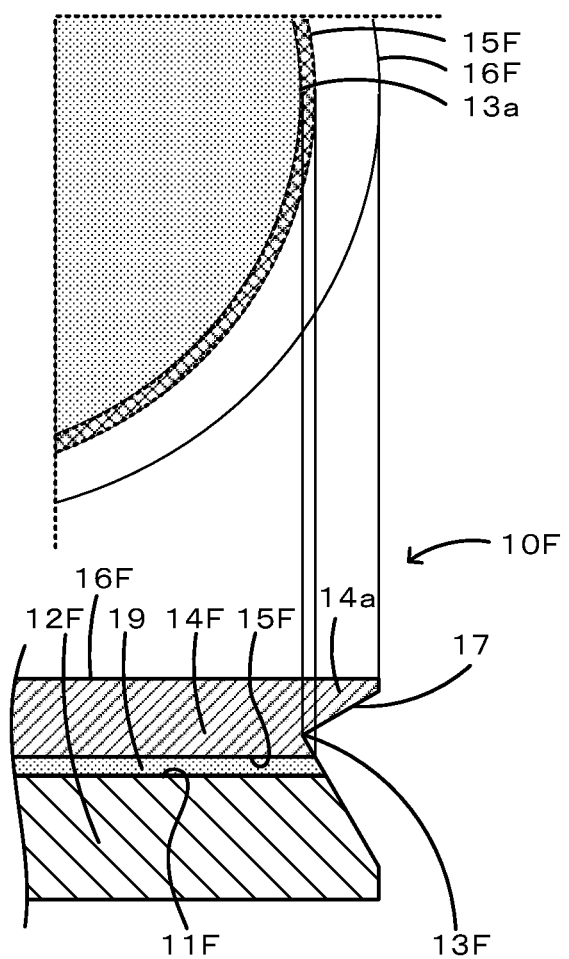
FIG. 9 shows schematic sectional views illustrating the structure of a composite substrate 10F.

In the above-described embodiment, the constricted part 13 is formed in the support substrate 12. However, as illustrated in FIG. 9, a composite substrate 10F may be formed such that a constricted part 13F is formed in a piezoelectric substrate 14F. In the composite substrate 10F, the constricted part 13F is formed in the piezoelectric substrate 14F such that a cross section 13a of the constricted part 13F that is parallel to a first surface 15F is inside the first surface 15F when the cross section 13a is projected onto the first surface 15F in a direction perpendicular to the first surface 15F. The composite substrate 10F also has an outer peripheral surface that extends continuously from the piezoelectric substrate 14F to a support substrate 12F through the adhesive layer 19. The composite substrate 10F is also formed such that the first surface 15F is inside a second surface 16F when the first surface 15F is projected onto the second surface 16F in a direction perpendicular to the second surface 16F. Accordingly, the occurrence of defects at the edge portion can be reduced.

Figure 10:
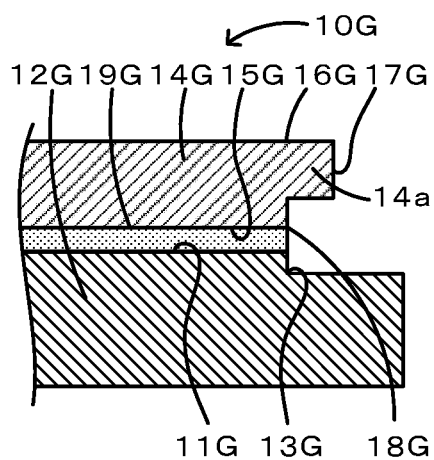
FIG. 10 is a schematic sectional view illustrating the structure of a composite substrate 10G.

In the above-described embodiment, the outer peripheral surface 17 is formed such that, in a cross section that is perpendicular to the second surface 16 and that passes through the center of the composite substrate 10, an angle θ between the tangent line that extends from the first surface 15 toward the bulging portion 14a and the extension line of the first surface 15 is acute. However, as illustrated in FIG. 10, a composite substrate 10G may include a piezoelectric substrate 14G having a stepped shape such that the circumference at the a second surface 16G is larger than that at a first surface 15G. The composite substrate 10G also has an outer peripheral surface that extends continuously from the piezoelectric substrate 14G to a support substrate 12G through the adhesive layer 19. The composite substrate 10G is also formed such that the first surface 15G is inside a second surface 16G when the first surface 15G is projected onto the second surface 16G in a direction perpendicular to the second surface 16G. Accordingly, the volume at the second surface side can be made relatively large, and the occurrence of defects at the edge portion can be reduced.

In the above-described embodiment, the support substrate 12 and the piezoelectric substrate 14 are bonded together with the adhesive layer 19, and then the outer peripheral surface is formed by grinding the outer peripheral surface. However, the present invention is not particularly limited to this, and the support substrate 12 and the piezoelectric substrate 14 may instead be bonded together with the adhesive layer 19 after the support substrate 12 and the piezoelectric substrate 14 are formed such that the first surface 15 is inside the second surface 16 when the first surface 15 is projected onto the second surface 16 in a direction perpendicular to the second surface 16.

In the above-described embodiment, a part of the support substrate 12 is ground. However, the present invention is not limited to this, and the piezoelectric substrate 14 and the adhesive layer 19 may be ground while the support substrate 12 is not ground.

EXAMPLES

Examples of the composite substrates according to the present invention that have been actually manufactured will now be described.

Example 1

First, a lithium tantalate substrate (LT substrate) including an orientation flat (OF) portion and having a diameter of 100 mm and a thickness of 250 µm was prepared as the piezoelectric substrate 14. In addition, a silicon substrate including an OF portion and having a diameter of 100 mm and a thickness of 350 µm was prepared as the support substrate 12 (FIG. 2(*a*)). The LT substrate was a 42° rotated Y-cut X-propagation LT substrate in which X is the propagation direction of the surface acoustic wave (SAW). The LT substrate had a chamfered or rounded corner. Referring to FIG. 2(*a*), the corner of the LT substrate was chamfered or rounded from a position 300 µm inward from the outer peripheral surface of the LT substrate, and the angle of chamfer at this position was 20°. Then, an epoxy adhesive was applied to the silicon substrate by spin coating, and the LT substrate was bonded to the silicon substrate. Then, the LT substrate and the silicon substrate were heated to 180° C. Thus, the bonded substrate 20 in which the thickness of the adhesive layer 19 (layer formed as a result of solidification of the epoxy adhesive) was 0.3 µm was formed (FIG. 2(*b*)).

Next, the outer peripheral surface of the bonded substrate 20 was ground by using the grinding device 30 illustrated in FIGS. 3 and 4 (FIG. 2(*c*)). In this example, the outer peripheral surface of the bonded substrate 20 was ground by using the grindstone portion 38 with which the angle θ between the extension surface of the bonding surface 11 and the tangent line at a crossing section 18 can be set to 45°. The height of the grinding wheel 34 was adjusted so that the bottom surface of the grindstone portion 38 is 100 µm below the surface of the silicon substrate. After the grinding process, referring to FIG. 2(*c*), the silicon substrate was ground by 100 µm from the surface and 1 mm from the outer periphery. However, the original outer diameter was maintained. The LT substrate and the adhesive layer were ground to a position 1 mm inward from the outer periphery of the silicon substrate. Thus, after the grinding process, the chamfered or rounded portion of the LT substrate was eliminated. In addition, the outer peripheral surface of the LT substrate, the outer peripheral surface of the adhesive layer, and the outer peripheral surface of a part of the silicon substrate that is adjacent to the adhesive layer were flush with each other. The grinding wheel 34 was rotated so that the length of the outer peripheral surface of the grindstone portion 38 that passes a contact position between the grindstone portion 38 and the bonded substrate 20 per second was 1,500 m. The rotating table 32 was rotated so that the length of the outer peripheral surface of the bonded substrate 20 that passes the contact position between the grindstone portion 38 and the bonded substrate 20 per second was 5 mm.

Next, the LT substrate was polished with a polishing machine until the thickness of the LT substrate was reduced to 30 µm (FIG. 2(*d*)). In this example, a polishing machine that performs mirror-polishing after reducing the thickness was used. Specifically, in the process of reducing the thickness, the bonded substrate 20 with the ground outer peripheral surface (ground substrate) was placed between a polishing plate and a pressure plate. Then, the pressure plate was rotated while slurry including abrasive grains was supplied to between the ground substrate and the polishing plate and the ground substrate is pressed against the polishing plate surface with the pressure plate. Next, in the process of mirror polishing, the polishing plate was changed to a polishing plate having a pad bonded thereto and the abrasive grains were changed to those having a higher grain size number. Then, the pressure plate was rotated and revolved, so that the surface of the piezoelectric substrate was mirror polished. First, the ground substrate, that is, the LT substrate, was pressed against the polishing plate surface and was continuously polished for 60 minutes at a rotation speed of 100 rpm. Next, the polishing plate was changed to a polishing plate having a pad bonded thereto and the abrasive grains were changed to those having a higher grain size number. Then, mirror polishing was continuously performed for 60 minutes at a rotation speed of 100 rpm and a revolution speed of 100 rpm while the pressure at which the ground substrate was pressed against the polishing plate surface was set to 0.2 MPa. Five composite substrates 10 were manufactured by the same manufacturing process, and none of the LT substrates caused chipping at the rim thereof.

Examples 2 and 3

As Examples 2 and 3, the composite substrates 10 were manufactured by a manufacturing process similar to that of Example 1 except the outer peripheral surface of the bonded substrate 20 was ground by using the grindstone portion 38 with which the angle θ between the extension surface of the bonding surface 11 and the tangent line at the crossing section 18 can be set to 60° and 70°, respectively.

Comparative Example 1

Figure 11:
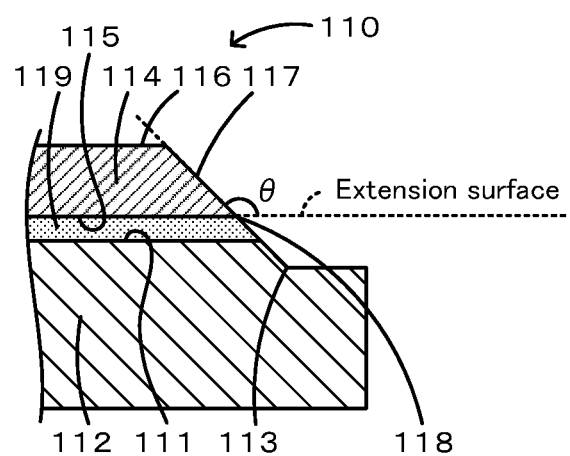
FIG. 11 is a schematic sectional view illustrating the structure of a composite substrate 110 according to Comparative Example 1.

FIG. 11 is a schematic sectional view illustrating the structure of a composite substrate 110 according to Comparative Example 1. In Comparative Example 1, the bonded substrate 20 illustrated in FIG. 2(*b*) was manufactured, and then the outer peripheral surface of the bonded substrate 20 was ground by using the grindstone portion 38 with which the angle θ between the extension surface of a first surface 115 and the tangent line at a crossing section 118 can be set to 135°. With regard to the other points, the manufacturing process of Comparative Example 1 was similar to that of Example 1. In the composite substrate 110, assuming that a surface of a piezoelectric substrate 114 that is bonded to a support substrate 112 is defined as the first surface 115 and a surface at the side opposite to the first surface 115 is defined as a second surface 116, the piezoelectric substrate 114 is formed such that the first surface 115 protrudes from the second surface 116 when the first surface 115 is projected onto the second surface 116 in a direction perpendicular to the second surface 116. In addition, in the composite substrate 110, an outer peripheral surface 117 is ground such that the circumference thereof decreases toward the second surface 116 (top surface) of the piezoelectric substrate 114. Five composite substrates according to Comparative Example 1 were manufactured. Similar to the composite substrates according to Example 1, none of the LT substrates caused chipping at the rim thereof. Thus, it was found that when the LT substrate is polished after the outer peripheral surface of the bonded substrate 20 is ground, the occurrence of chipping of the LT substrate can at least be reduced in the polishing process.

Comparative Example 2

As Comparative Example 2, the composite substrates 110 were manufactured by a manufacturing process similar to that of Comparative Example 1 except the outer peripheral surface of the bonded substrate 20 was ground by using the grindstone portion 38 with which the angle θ between the extension surface of the bonding surface 111 and the tangent line at the crossing section 118 can be set to 105°.

Figure 12:
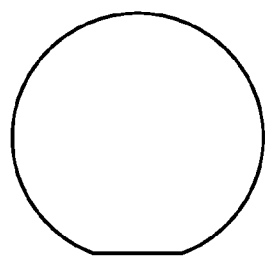
FIG. 12 is a schematic diagram illustrating composite substrates according to Example 1 and Comparative Example 1 after a heating process.
Figure 12:
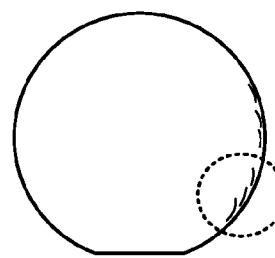
Figure 12:
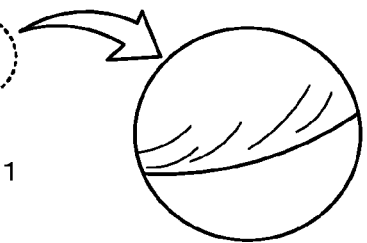

Next, the composite substrates according to Examples 1 to 3 and Comparative Examples 1 and 2 were heated in air at 260° C. for an hour. Table 2 shows the angle θ and the presence/absence of cracks after the heating process in the composite substrates according to Examples 1 to 3 and Comparative Examples 1 and 2. FIG. 12 is a schematic diagram illustrating the composite substrates according to Example and Comparative Example after the heating process. As is clear from Table 2 and FIG. 12, no defects, such as chipping and cracks, were observed at the edge portions of the composite substrates 10 according to Examples 1 to 3 after the heating process. In contrast, in Comparative Example 1, small cracks were observed at the edge portion of the piezoelectric substrate 114 after the heating process. As a result, it was found that the occurrence of defects at the edge portion of the composite substrate can be reduced by forming the outer peripheral surface 17 such that the angle θ between the tangent line at the crossing section 18 between the first surface 15 of the piezoelectric substrate 14 and the outer peripheral surface 17 and the extension surface of the first surface 15 of the piezoelectric substrate is in the range of 0°<θ<90°. In particular, it was found that the occurrence of defects at the edge portion of the composite substrate can be reduced by forming the piezoelectric substrate 14 such that the first surface 15 is inside the second surface 16 when the first surface 15 is projected onto the second surface 16 in a direction perpendicular to the second surface 16, as in Examples 1 to 3. In addition, it was found that the occurrence of defects at the edge portion of the composite substrate can be reduced by forming the outer peripheral surface 17 such that the angle θ between the tangent line at the crossing section 18 between the first surface 15 of the piezoelectric substrate 14 and the outer peripheral surface 17 and the extension surface of the first surface 15 of the piezoelectric substrate is acute.

TABLE 2

|  | Angle (°) | Presence/absence of cracks |
|---|---|---|
| Example 1 | 45 | Not observed |
| Example 2 | 60 | Not observed |
| Example 3 | 70 | Not observed |
| Comparative Example 2 | 105 | Observed |
| Comparative Example 1 | 135 | Observed |

The present application claims the benefit of the priority from Japanese Patent Application No. 2009-177587 filed on Jul. 30, 2009, the entire contents of which are incorporated herein by reference.

Industrial Applicability

The present invention is applicable to the technical field of composite substrates including piezoelectric substrates.

The invention claimed is:

1. A composite substrate for a plurality of electronic devices comprising:
    a support substrate;
    a piezoelectric substrate; and
    an adhesive layer with which the support substrate and the piezoelectric substrate are bonded to each other,
    wherein, assuming that a surface of the piezoelectric substrate that is bonded to the support substrate is defined as a first surface and a surface at the side opposite to the first surface is defined as a second surface, the piezoelectric substrate has a bulging portion that is formed such that the first surface is inside the second surface when the first surface is projected onto the second surface in a direction perpendicular to the second surface, and
    wherein the composite substrate has a circular shape with a single flat portion and an outer peripheral surface that continuously extends from the piezoelectric substrate to the support substrate through the adhesive layer.

2. The composite substrate according to claim 1, wherein, in a cross section that is perpendicular to the second surface and that passes through the center of the composite substrate, an angle θ between the tangent line that extends from the first surface toward the bulging portion of the piezoelectric substrate and the extension line of the first surface is acute.

3. The composite substrate according to claim 2, wherein the angle θ is in the range of 45°≤θ≤70°.

4. A method for manufacturing the composite substrate of claim 1, the method comprising:
    (a) a step of preparing the support substrate and the piezoelectric substrate having a corner that is chamfered or rounded;
    (b) a step of forming a bonded substrate by bonding a bonding portion at a surface of the support substrate and a back surface of the piezoelectric substrate to each other with the adhesive layer interposed therebetween; and
    (c) a step of grinding an outer peripheral surface of the bonded substrate and polishing a surface of the piezoelectric substrate with a polishing plate while abrasive grains are provided between the surface of the piezoelectric substrate and the polishing plate so that a thickness of the piezoelectric substrate is reduced and the surface of the piezoelectric substrate is mirror polished,
    wherein, in step (c), forming the bulging portion in the piezoelectric substrate such that the first surface is inside the second surface when the first surface is projected onto the second surface in a direction perpendicular to the second surface, and processing the bonded substrate such that the outer peripheral surface that continuously extends from the piezoelectric substrate to the support substrate through the adhesive layer is formed.

5. The composite substrate according to claim 4, wherein in step (c), an original outer diameter of the support substrate is maintained.

6. The composite substrate according to claim 1, the support substrate has an outer diameter that is larger than an outer diameter of the adhesive layer.

7. The composite substrate according to claim 1, the support substrate has an outer diameter that is larger than an outer diameter of the piezoelectric substrate.

8. The composite substrate according to claim 1,
the outer peripheral surface has a curved shape.

9. The composite substrate according to claim 8,
wherein the support substrate has a constricted part of which an outer peripheral surface is smaller than an outer peripheral surface of the adhesive layer,
the curved outer peripheral surface extends substantially perpendicularly from a constricted part toward a bonding surface, is gradually inclined outward, and, extends continuously from the support substrate to the piezoelectric substrate through the adhesive layer, and,
as the outer peripheral surface of the composite substrate extends toward the second surface from the first surface, the direction of outward inclination of the outer peripheral surface of the composite substrate becomes closer to a direction substantially perpendicular to the piezoelectric substrate.

10. The composite substrate according to claim 1,
wherein the support substrate is bonded to the piezoelectric substrate by the adhesive layer without a gap.

11. The composite substrate according to claim 1,
wherein the support substrate is unmetalized.

\* \* \* \* \*